United States Patent
Loh et al.

(10) Patent No.: US 6,670,237 B1
(45) Date of Patent: Dec. 30, 2003

(54) METHOD FOR AN ADVANCED MIM CAPACITOR

(75) Inventors: Wye Boon Loh, Singapore (SG); Chit Hwei Ng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 61 days.

(21) Appl. No.: 10/209,729

(22) Filed: Aug. 1, 2002

(51) Int. Cl.$^7$ .......................................... H01L 21/8242
(52) U.S. Cl. ...................................... 438/253; 438/210
(58) Field of Search ................................ 438/197, 210, 438/238, 239, 241, 253, 256, 396, 706

(56) References Cited

U.S. PATENT DOCUMENTS 6,329,234 B1 * 12/2001 Ma et al.
6,472,124 B1 * 10/2002 Chung

* cited by examiner

Primary Examiner—Phuc T. Dang (57) ABSTRACT

A method for forming a capacitor in a semiconductor device. An embodiment simultaneously forms a MIM capacitor and a dual damascene interconnect using common process steps. An embodiment comprises: forming a capacitor bottom plate and a first metal line over the semiconductor structure. We form a second dielectric layer over the capacitor bottom plate, the first metal line, and a first dielectric layer. Next, we form a top plate opening in the second dielectric layer to at least partially expose the capacitor bottom plate. A capacitor dielectric layer is formed over the capacitor bottom plate and the second dielectric layer. A capacitor top plate is formed in the top plate opening. Subsequently, we form a via opening through at least the second dielectric layer, the capacitor dielectric layer over the first metal line to expose a portion of the first metal line. Next, we fill the via opening with a second metal layer to form a via plug. A third dielectric layer is formed over the via plug and the capacitor top plate. We form a first trench opening and a second trench opening through the third dielectric layer, the second passivation layer and the third passivation layer. The first trench opening exposes a portion of the capacitor top plate. The second trench opening exposes a portion of the via plug. Next, we form a first trench plug in first trench opening and a second trench plug is the second trench opening. The top plate, the capacitor dielectric and the bottom plate form a capacitor.

20 Claims, 6 Drawing Sheets

METHOD FOR AN ADVANCED MIM CAPACITOR

BACKGROUND OF INVENTION

1) Field of the Invention

Some embodiments of this invention relates generally to the fabrication of semiconductor devices and particularly to the fabrication of a capacitor in a device and more particularly to a MIM (metal—insulator—metal) capacitor.

2) Description of the Prior Art

In many mixed signal or high frequency RF applications both high performance, high speed capacitors and inductors are required. Low series resistance, low loss, high Q and low (RC) time constants are required in these high frequency applications for high performance. In addition, it is important to fabricate device structures by processes compatible with CMOS processing with AlCu alloys to pure copper in dual damascene structures.

A metal—insulator—metal (MIM) capacitor is used commonly in high performance applications in CMOS technology. Typically, the capacitor has a sandwich structure and can be described as a parallel plate capacitor. The capacitor top metal (CTM) is separated from the capacitor bottom metal (CBM) by a thin insulating layer. Both two parallel plates are conventionally made from Al or AlCu alloys. These metals are patterned and etched needing several photolithography photo masking steps. The thin insulating dielectric layer is usually made from silicon oxide or silicon nitride deposited by chemical vapor deposition (CVD).

The damascene processing is a common method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners, underlying diffusion barriers, have been coated with chemical vapor deposited (CVD) W metal, then polished back to oxide.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

There is a challenge to determine a process that will form capacitors and interconnects using common process steps.

The importance of overcoming the various deficiencies noted above is evidenced by the extensive technological development directed to the subject, as documented by the relevant patent and technical literature. The apparently more relevant technical developments in the patent literature can be gleaned by considering U.S. Pat. No. 6,338,999b1(Huse et al.) that shows a process for dual damascenes capacitors.

U.S. Pat. No. 6,329,234b1(Ma et al.) reveals a Cu compatible capacitor process.

U.S. Pat. No. 6,281,134b1(Yeh et al.) shows a process for combining a logic circuit and a capacitor.

U.S. Pat. No. 6,271,084b1(Tu et al.) shows a process for a MIM capacitor using a chemical-mechanical polish (CMP) process.

U.S. Pat. No. 6,025,226(Gambino et al.) shows a method for a capacitor using chemical-mechanical polishing (CMP).

U.S. Pat. No. 6,180,976b1(Roy) shows a thin film capacitor method.

U.S. Pat. No. 6,255,151b1(Fukuda et al.) shows a capacitor method using a chemical-mechanical polish (CMP) step.

SUMMARY OF THE INVENTION

It is an object of an embodiment of the present invention to provide a method for fabricating a capacitor.

It is an object of an embodiment of the present invention to provide a method for fabricating a metal—insulator—metal (MIM) capacitor.

An embodiment of the present invention provides a method of manufacturing a capacitor which is characterized as follows. A capacitor bottom plate and a first metal line are formed over the semiconductor structure. We form a second dielectric layer over the capacitor bottom plate, the first metal line, and a first dielectric layer. Next, we form a top plate opening in the second dielectric layer to at least partially expose the capacitor bottom plate. A capacitor dielectric layer is formed over the capacitor bottom plate and the second dielectric layer. We form a capacitor top plate in the top plate opening. Subsequently, we form a via opening through at least the second dielectric layer and the capacitor dielectric layer over the first metal line to expose a portion of the first metal line. Next, we fill the via opening with a second metal layer to form a via plug. We form a third dielectric layer over the via plug and the capacitor top plate. We form a first trench opening and a second trench opening through the third dielectric layer, the second passivation layer and the third passivation layer. The first trench opening exposes a portion of the capacitor top plate. The second trench opening exposes a portion of the via plug. Next, we form a first trench plug in first trench opening and a second trench plug is the second trench opening. The top plate, the capacitor dielectric and the bottom plate form a capacitor. The via plug and the second trench plug form a interconnect.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A preferred embodiment of the invention forms a capacitor and more preferably forms an advanced RF Metal—Insulator—Metal (MiM) capacitor that is suitable for 01.3 $\mu$m technology and below. A preferred embodiment is described below.

Figure 1A:
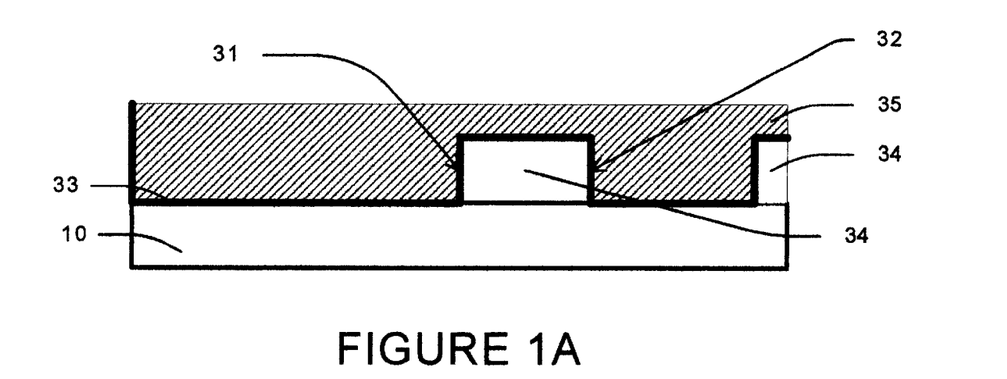
FIG. 1A is a cross sectional view for illustrating a method for forming a capacitor according to an embodiment of the present invention.

As shown in FIG. 1A, we provide a semiconductor structure 10. The semiconductor structure 10 preferably has a top surface comprised of at least an upper dielectric layer. The top surface could comprise an inter metal dielectric (IMD) or interlevel dielectric (ILD) layer with embedded conductors or lines. The top surface preferably comprises an IMD layer with embedded conductors or lines.

Semiconductor structure 10 is understood to possibly include a semiconductor wafer, active and passive devices formed within the wafer; and insulating and conductive layers formed on or over the wafer surface. The term "structure surface" is meant to include the upper most exposed layers over a semiconductor wafer, such as an insulating layer and/or conductive lines.

Figure 1B:
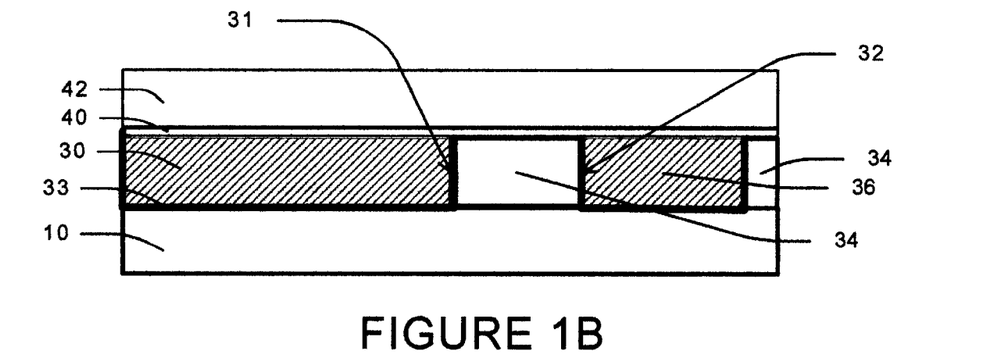
FIG. 1B is a cross sectional view for illustrating a method for forming a capacitor according to an embodiment of the present invention.

We form a capacitor bottom plate 30, a first metal line 36, and a first dielectric layer 34 over the semiconductor structure 10 (See FIG. 1B). The capacitor bottom plate 30, is spaced from the first metal line 36 preferably by the first dielectric layer. The first dielectric layer can be comprised of one or more layers. The capacitor bottom plate 30, a first metal line 36 can be formed using a damascene or dual damascene process.

The capacitor bottom plate 30, a first metal line 36, and a first dielectric layer 34 can be formed on a dielectric layer such as a 3rd level dielectric layer or 3rd level inter metal dielectric (IMD) layer. The dielectric layer is preferably an uppermost layer of the semiconductor structure 10. Also, the first metal line 36 and the capacitor bottom plate 30 can for be formed simultaneously from the fourth level metal layer. Also, the first dielectric layer 34 could be an inter metal dielectric (IMD) layer such as a fourth level IMD layer.

As shown in FIG. 1A, we form a first dielectric layer 34 over a semiconductor structure 10. The first dielectric layer 34 preferably has a thickness between 1000 and 10,000 Å. Next, we form a capacitor bottom plate opening 31 and a first metal line opening 32 in the first dielectric layer 34.

With reference to FIG. 1A, we form a barrier layer 33 and metal layer 35 over the first dielectric layer 34 and the semiconductor structure 10. The metal layer preferably fills the capacitor bottom plate opening 31 and the first metal line opening 32. The metal layer is preferably comprised of Cu or Cu alloy. The barrier layer 33 (e.g., capacitor bottom plate barrier layer) is preferably a copper barrier layer such as Ta or TaN.

Next, we planarize, preferably by chemically mechanically polishing, the metal layer to form the capacitor bottom plate 30, and the first metal line 36. The capacitor bottom plate 30 and the first metal line 36 could be formed by a damascene process or by a metal patterning/etching process. The first dielectric layer 34 preferably has a thickness between about 1000 and 10,000 Å. The barrier layer 33 is preferably removed from over the dielectric layer 34.

Referring to FIG. 1B, we form a first passivation layer 40 over at least the capacitor bottom plate 30. The first passivation layer 40 is preferably comprised of a low dielectric constant (>3.0) etch stop layer, such as silicon nitride (SiN) or SiC and most preferably comprised of SiN and preferably has a thickness of between about 100 and 1000 Å. The passivation layer can be used as an etch stop is a subsequent damascene or dual damascene process.

As shown in FIG. 1B, we form a second dielectric layer 42 over the capacitor bottom plate 30, the first metal line 36, and a first dielectric layer 34. Preferably the second dielectric layer is comprised of oxide and has preferably a thickness between 1000 and 10,000 Å.

Figure 2:
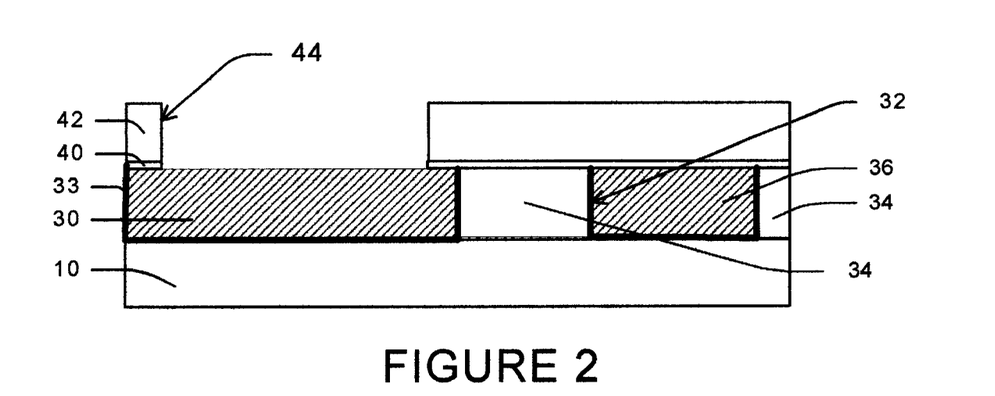
FIG. 2 is a cross sectional view for illustrating a method for forming a capacitor according to an embodiment of the present invention.

Referring to FIG. 2, we form a top plate opening 44 (e.g., damascene trench opening) in the second dielectric layer 42 and first passivation layer 40 to at least partially expose the capacitor bottom plate 30. Preferably the first passivation layer is used as a etch stop during the etch opening process.

Figure 3:
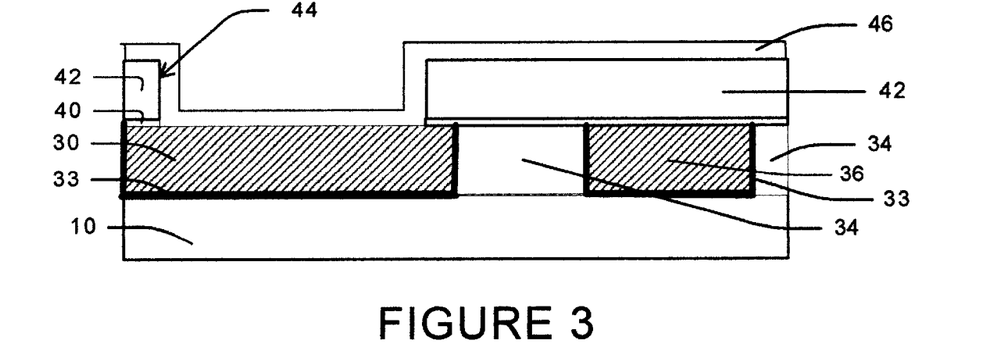
FIG. 3 is a cross sectional view for illustrating a method for forming a capacitor according to an embodiment of the present invention.

Referring to FIG. 3, we form a capacitor dielectric layer 46 over the capacitor bottom plate 30, and the second dielectric layer 42. The capacitor dielectric layer 46 is preferably comprised of a high k material with a dielectric constant greater than 3.0. Preferably the capacitor dielectric layer 46 is comprised of silicon oxynitride (SiON), barium strontium titanate or silicon nitride (SiN) and more preferably comprised of SiN.

Figure 4:
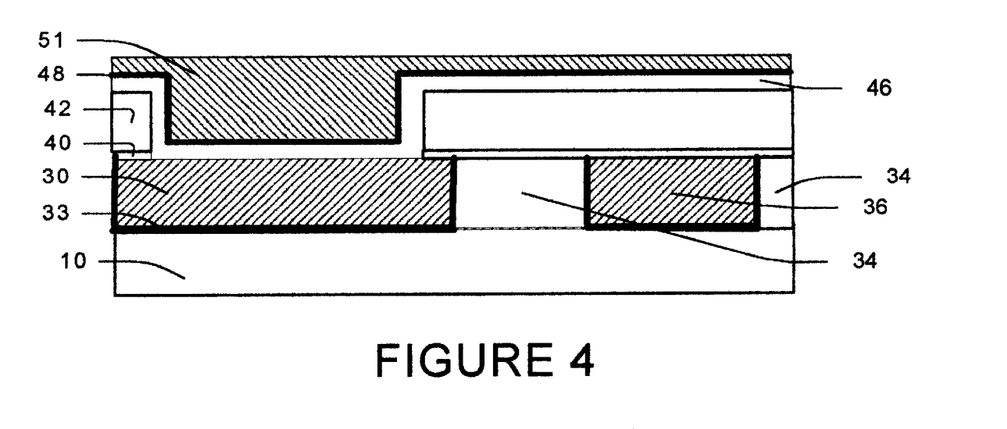
FIG. 4 is a cross sectional view for illustrating a method for forming a capacitor according to an embodiment of the present invention.

As shown in FIG. 4, in an optional step, we form an optional barrier layer (e.g., top plate barrier layer) 48 over the capacitor dielectric layer 46. Preferably the barrier layer is comprised of TiN or TaN.

Still referring to FIG. 4, we form a first metal layer 51 over capacitor dielectric layer 46 and, if present, the (optional) barrier layer 48. Preferably the first metal layer 51 is preferably comprised of Cu, W or Al or alloys thereof and most preferably is comprised of a copper alloy.

Figure 5:
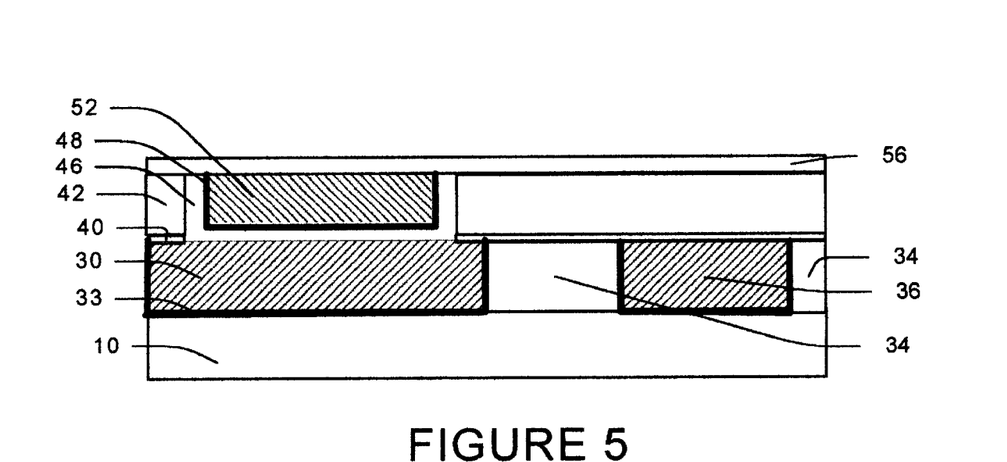
FIG. 5 is a cross sectional view for illustrating a method for forming a capacitor according to an embodiment of the present invention.

As shown in FIG. 5, we planarize the metal layer 51 to form a capacitor top plate 52 in the top plate opening 44 and to preferably remove the capacitor dielectric layer 46 and barrier layer 48 (if present) from over the second dielectric layer 42 and expose at least portions of the dielectric layer 42. The planarization of the metal layer 51 preferably comprises chemical-mechanical polishing the metal layer 51.

As shown in FIG. 5, we preferably form a second passivation layer 56 over the capacitor top plate 52 and the second dielectric layer 42. The second passivation layer 56 is preferably comprised of SiN or SiC and has a thickness of between about 100 and 1000 Å.

Figure 6:
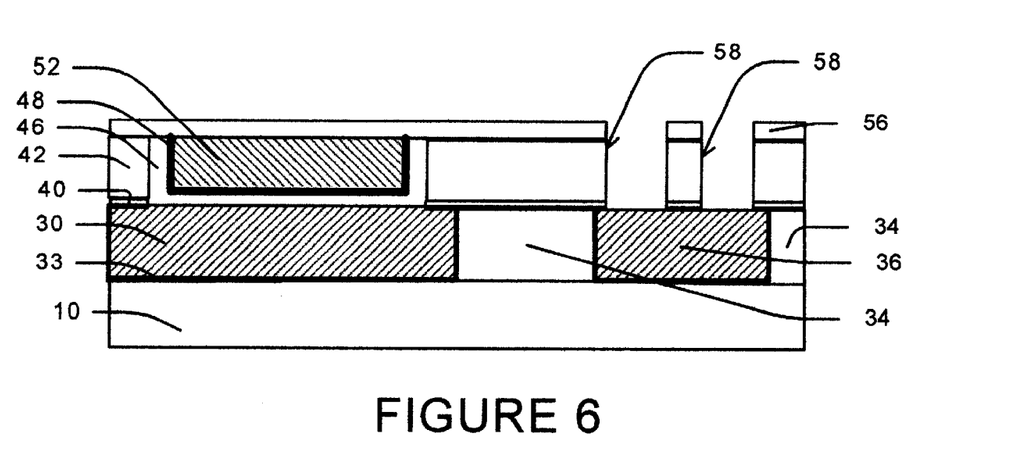
FIG. 6 is a cross sectional view for illustrating a method for forming a capacitor according to an embodiment of the present invention.

Referring to FIG. 6, we form a (e.g., at least one) via opening(s) 58 through at least the second passivation layer 56, the second dielectric layer 42, and the first passivation layer 40 over the first metal line 36 to expose a portion of the first metal line 36. In this illustration, two via openings 58 are formed to the metal line 36 to illustrate via opengings to expose underlying conductive (e.g. metal) line interconnects. Preferably the first passivation layer 40 is used as an etch stop during the via opening process.

Figure 7:
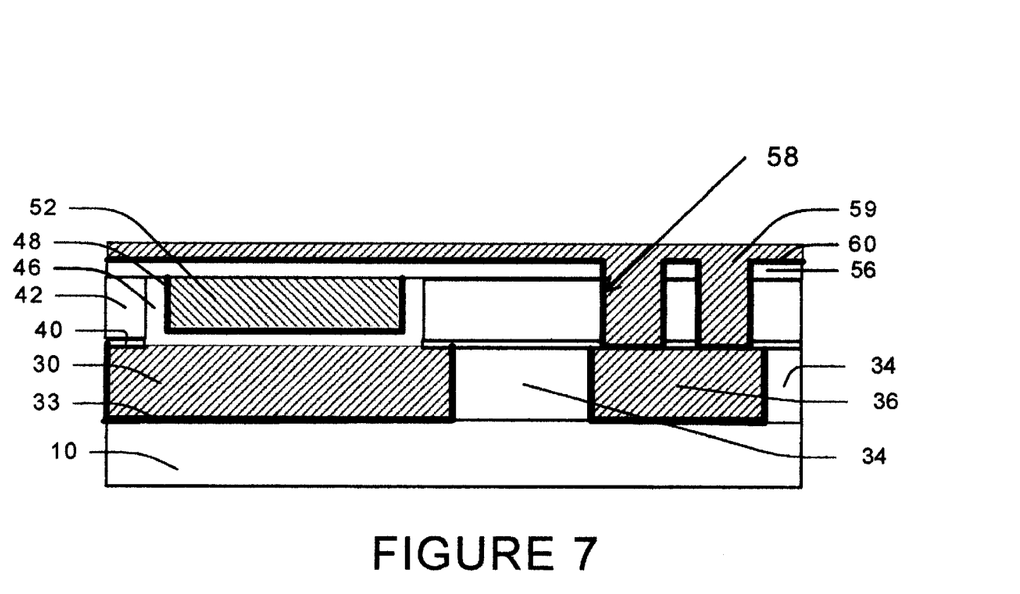
FIG. 7 is a cross sectional view for illustrating a method for forming a capacitor according to an embodiment of the present invention.
Figure 8:
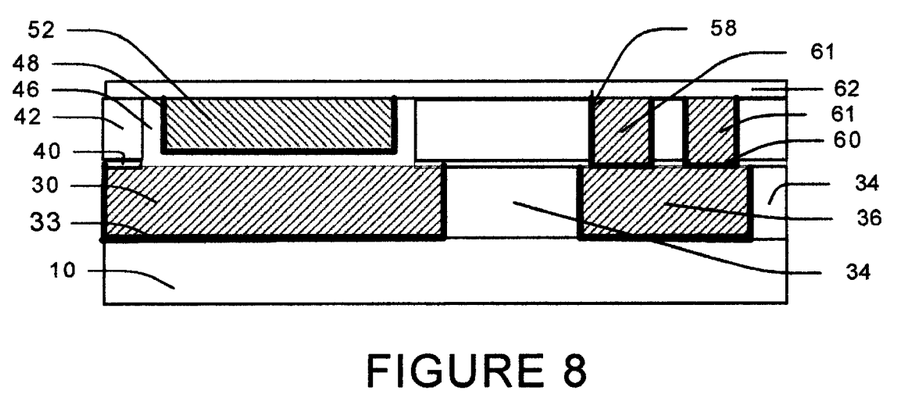
FIG. 8 is a cross sectional view for illustrating a method for forming a capacitor according to an embodiment of the present invention.

As shown in FIGS. 7 & 8, we fill the via opening(s) 58 with a via plug barrier layer 60 and second metal layer 59 to form a via plug(s) 61. Referring to FIG. 7, we preferably form a via plug barrier layer 60 and a second metal layer 59 over the semiconductor structure 10 and fill the via opening (s) 58. As shown in FIG. 8, we preferably chemical-mechanical polish the second metal layer 59 to a level about even with the top of the second dielectric layer 42 to form plug via(s) 61. The second passivation layer 56 is preferably removed and portions of the barrier layer 60 are removed. Preferably the second metal layer is comprised of Copper. The via plug barrier layer 60 is preferably comprised of a copper barrier layer such as Ta or TaN.

As shown in FIG. 8, we form a third passivation layer 62 over the via plug(s) 61 and the capacitor top plate 52. The third passivation layer 62 is preferably comprised of SiN or SiC and has a thickness of between about 100 and 1000 Å.

Figure 9:
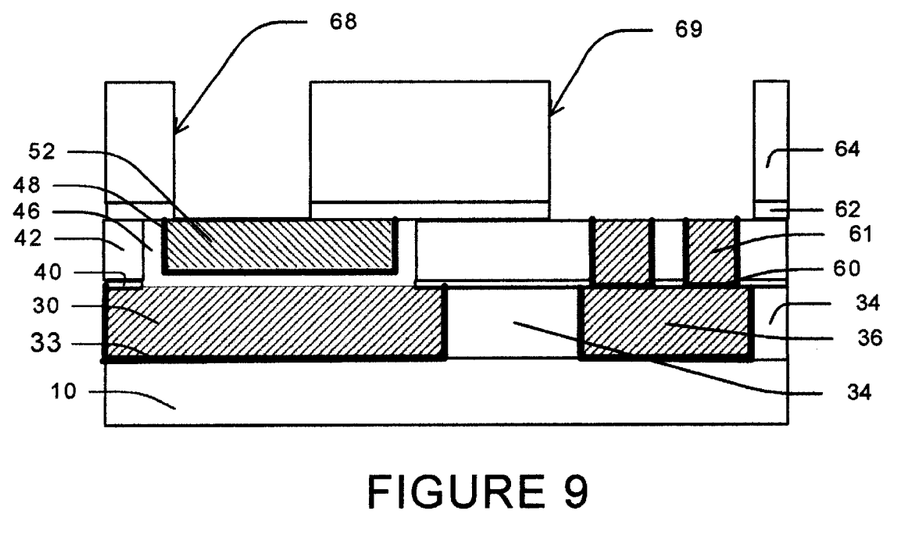
FIG. 9 is a cross sectional view for illustrating a method for forming a capacitor according to an embodiment of the present invention.

As shown in FIG. 9, we form a third dielectric layer 64 over the third passivation layer 62. The third dielectric layer 64 is preferably comprised of oxide and has a thickness of between about 1000 and 10,000 Å.

Still referring to FIG. 9, we form a first trench opening 68 and a second trench opening 69 (upper trench openings) through the third dielectric layer 64 and the third passivation layer 62. The first trench opening 68 exposes a portion of the capacitor top plate 52. The second trench opening 69 exposes a portion of the via plug 61. Preferably the third passivation layer serves as an etch stop during the opening process.

Figure 10:
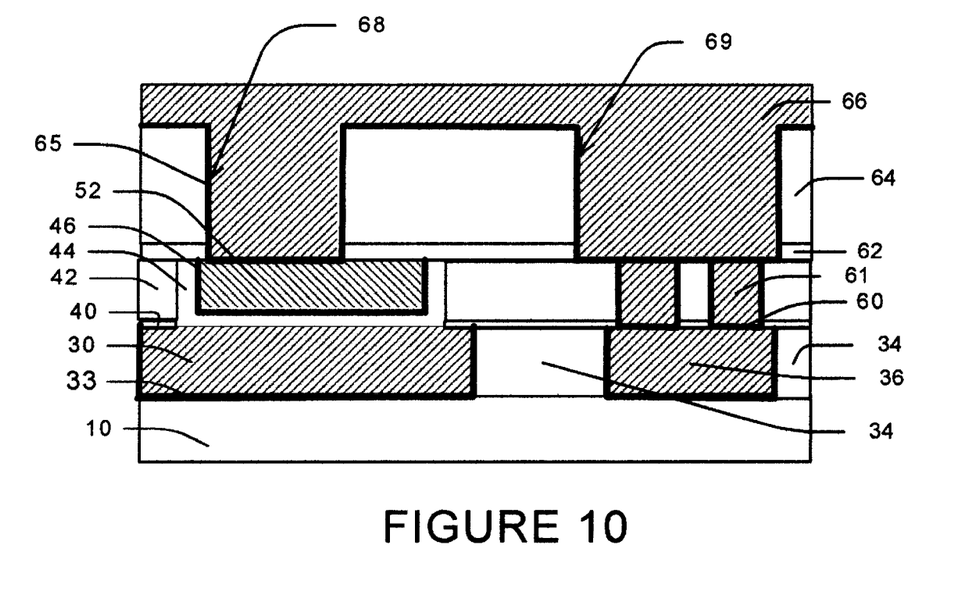
FIG. 10 is a cross sectional view for illustrating a method for forming a capacitor according to an embodiment of the present invention.

FIG. 10 shows an upper trench barrier layer 65 and a third metal layer 66 formed at least filling the first trench opening 68 and a second trench opening 69. Preferably the third metal layer is comprised of copper. The upper trench barrier layer 65 is preferably comprised of TiN or TaN.

Figure 11:
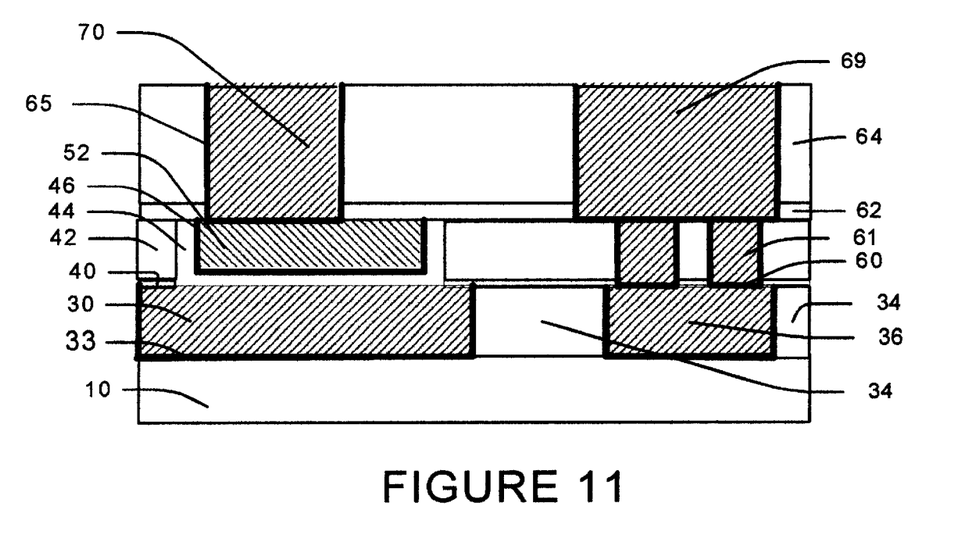
FIG. 11 is a cross sectional view for illustrating a method for forming a capacitor according to an embodiment of the present invention.

With reference to FIG. 11, we planarize the third metal layer 66 to form a first trench plug 70 (or capacitor top plate trench plug 70) in first trench opening 68 and a second trench plug 69 is the second trench opening 69. The planarization is preferably a chemical-mechanical polish (CMP) process. Preferably the barrier layer 65 is removed over the third dielectric layer 64. The via plug(s) 61 and the second trench plug 69 form a interconnect or metal line 61 69.

The top plate 52, the capacitor dielectric 46 and the bottom plate 30 form a capacitor. The capacitor top plate trench plug 70 contacts the top plate 52. A RF device preferably comprises the capacitor.

BENEFITS OF THE INVENTION

The embodiments of the invention have the following benefits:

No oxide chemical-mechanical polish (CMP) is required to planarize the dielectric layers (e.g., 42—FIG. 5). Since the MIM capacitor formation has not formed any additional typography or step height, no oxide CMP is required to planarize layer 42 due to capacitor formation. This reduces costs. This is in-line with the current Cu protocol.

Requires only one additional mask to define the top-MIM plate. See e.g., FIG. 3, opening 44 can be formed using a photoresist expose/develop step to used to pattern second dielectric layer 42.

No oxide step height differences for via etch to stop on the previous metal. See FIG. 10. Has easy plug-in standard via-etch (See e.g., via openings 58 in FIG. 6.)

Can be easily integrated into the present 0.13 $\mu$m single or dual damascene process.

Allows choice of different high K and top plate materials.

No metal etch required. The preferred embodiments use CMP/damascene process to pattern the lines and capacitor top and bottom plates. Thus no additional machines are required.

Top and bottom plates are preferably comprised of Cu which is a superior material for RF devices.

As a preface to the detailed description, it should be noted that, as used in this specification and the appended claims, the singular forms "a", "an", and "the" include plural referents, unless the context clearly dictates otherwise.

In the above description numerous specific details are set forth such as thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

In the specification and claims any numeric values are to be interpreted to have the term "about" preceding them, unless explicitly indicated.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a capacitor; comprising the steps of:

a) providing a semiconductor structure;

b) forming a capacitor bottom plate, and a first metal line separated by portions of a first dielectric layer over said semiconductor structure;

c) forming a first passivation layer over at least said capacitor bottom plate;

d) forming a second dielectric layer over said capacitor bottom plate, said first metal line, and a first dielectric layer;

e) forming a top plate opening in said second dielectric layer and first passivation layer to at least partially expose said capacitor bottom plate;

f) forming a capacitor dielectric layer over said capacitor bottom plate and said second dielectric layer;

g) forming a first metal layer over capacitor dielectric layer;

h) planarizing said first metal layer to form a capacitor top plate in said top plate opening;

i) forming a second passivation layer over said capacitor top plate and said second dielectric layer;

j) forming a via opening through at least said second dielectric layer, said capacitor dielectric layer, said second passivation layer and said first passivation layer over said first metal line to expose a portion of said first metal line;

k) filling said via opening with a second metal layer to form a via plug;

l) forming a third passivation layer over at least said via plug and said capacitor top plate;

m) forming a third dielectric layer over said third passivation layer;

n) forming a first trench opening and a second trench opening through said third dielectric layer and said third passivation layer;
said first trench opening exposes a portion of said capacitor top plate;
said second trench opening exposes a portion of said via plug;

o) forming a third metal layer at least filling said first trench opening and a second trench opening;

p) planarizing said third metal layer to form a first trench plug in first trench opening and to form a second trench plug is said second trench opening.

2. The method of claim 1 wherein said first dielectric layer has a thickness between 1000 and 10,000 Å.

3. The method of claim 1 wherein said capacitor bottom plate, and said first metal line are formed by:
forming a capacitor bottom plate opening and a first metal line opening in said first dielectric layer;
forming a first barrier layer and a metal layer over said first dielectric layer and said semiconductor structure and filling said capacitor bottom plate opening and said first metal line opening; and
chemically mechanically polishing said metal layer to form said capacitor bottom plate, and said first metal line.

4. The method of claim 1 wherein said first passivation layer is comprised of SiN or SiC and has a thickness of between about 100 and 1000 Å.

5. The method of claim 1 wherein said second dielectric layer is comprised of oxide and has a thickness between 1000 and 10,000 Å.

6. The method of claim 1 wherein said capacitor dielectric layer is comprised of SiN.

7. The method of claim 1 wherein said capacitor dielectric layer is comprised of a high k material with a dielectric constant greater than 3.0.

8. The method of claim 1 wherein said first metal layer comprised of a material selected from the group consisting of Cu, Cu alloys, W, W alloys, Al, and Al alloys.

9. The method of claim 1 wherein the planarization of said first metal layer comprises chemical-mechanical polishing said first metal layer.

10. The method of claim 1 wherein said second passivation layer is comprised of SiN or SiC and has a thickness of between about 100 and 1000 Å.

11. The method of claim 1 wherein the step of filling said filling said via opening with a second metal layer comprises:
forming a via plug barrier layer and said second metal layer over said semiconductor structure and filling said via opening; and
chemical-mechanical polishing said second metal layer to a level about even with the top of said second passivation layer;
said second metal layer is comprised of copper.

12. The method of claim 1 wherein said third dielectric layer is comprised of oxide and has a thickness of between about 1000 and 10,000 Å.

13. The method of claim 1 wherein said third passivation layer is comprised of SiN or SiC and has a thickness of between about 100 and 1000 Å.

14. The method of claim 1 wherein said second metal layer is comprised of copper.

15. The method of claim 1 wherein said third passivation layer is comprised of SiN or SiC and has a thickness of between about 100 and 1000 Å;
whereby said via plug and said second trench plug form an interconnect;
whereby said capacitor top plate, said capacitor dielectric and said bottom plate form a capacitor; said capacitor is part of a RF device.

16. The method of claim 1 wherein said capacitor bottom plate, said capacitor top plate, via plug; said first trench plug and said second trench plug include barrier layers.

17. A method of fabrication of a capacitor; comprising the steps of:

a) providing a semiconductor structure;

b) forming a first dielectric layer over said semiconductor structure;

c) forming a capacitor bottom plate opening and a first metal line opening in said first dielectric layer;

d) forming a capacitor bottom plate, and a first metal line over said semiconductor structure; said capacitor bottom plate fills said capacitor bottom plate opening; said first metal line fills said first metal line opening;
(1) said capacitor bottom plate, and said first metal line formed by:
forming a metal layer over said first dielectric layer and said semiconductor structure and filling said capacitor bottom plate opening and said first metal line opening;
and chemically mechanically polishing said metal layer to form said capacitor bottom plate, and said first metal line;

e) forming a first passivation layer over at least said capacitor bottom plate;

f) forming a second dielectric layer over said capacitor bottom plate, said first metal line, and a first dielectric layer;

g) forming a top plate opening in said second dielectric layer and first passivation layer to at least partially expose said capacitor bottom plate;

h) forming a capacitor dielectric layer over said capacitor bottom plate, and said second dielectric layer;

i) forming a barrier layer over said capacitor dielectric layer;

j) forming a first metal layer over capacitor dielectric layer and said barrier layer;
k) planarizing said metal layer to form a capacitor top plate in said top plate opening; and to remove said barrier layer from over said second dielectric layer;
   (1) the planarization of said metal layer comprises chemical-mechanical polishing said metal layer;
l) forming a second passivation layer over said capacitor top plate and said second dielectric layer;
m) forming a via opening through at least said second dielectric layer, said capacitor dielectric layer, said second passivation layer and said first passivation layer over said first metal line to expose a portion of said first metal line;
n) filling said via opening with a second metal layer to form a via plug;
   (1) the step of filling said filling said via opening with a second metal layer comprises:
      forming a via plug barrier layer and said second metal layer over said semiconductor structure and filling said via opening; and
      chemical-mechanical polishing said second metal layer to a level about even with the top of said second dielectric layer; portions of said second passivation layer are removed by the chemical-mechanical polishing;
o) forming a third passivation layer over said via plug and said capacitor top plate and said second dielectric layer;
p) forming a third dielectric layer over said third passivation layer;
q) forming a first trench opening and a second trench opening through said third dielectric layer and said third passivation layer;
   said first trench opening exposes a portion of said capacitor top plate;
   said second trench opening exposes a portion of said via plug;
r) forming a third metal layer at least filling said first trench opening and a second trench opening;
s) planarizing said third metal layer to form a first trench plug in first trench opening and a second trench plug is said second trench opening;
   (1) whereby said via plug and said second trench plug form a interconnect;
      whereby said top plate, said capacitor dielectric and said bottom plate form a capacitor; said capacitor is part of a RF device.

18. The method of claim 17 wherein said capacitor bottom plate, said capacitor top plate, via plug; said first trench plug and said second trench plug include barrier layers.

19. A method of fabrication of a capacitor; comprising the steps of:
   a) providing a semiconductor structure;
   b) forming a first dielectric layer over said semiconductor structure;
      (1) said first dielectric layer has a thickness between 1000 and 10,000 Å;
   c) forming a capacitor bottom plate opening and a first metal line opening in said first dielectric layer;
   d) forming a capacitor bottom plate, and a first metal line over said semiconductor structure; said capacitor bottom plate fills said capacitor bottom plate opening; said first metal line fills said first metal line opening;
      (1) said capacitor bottom plate, and said first metal line formed by:
         forming a metal layer over said first dielectric layer and said semiconductor structure and filling said capacitor bottom plate opening and said first metal line opening;
         and chemically mechanically polishing said metal layer to form said capacitor bottom plate, and said first metal line;
   e) forming a first passivation layer over at least said capacitor bottom plate;
      (1) said first passivation layer is comprised of SiN or SiC and has a thickness of between about 100 and 1000 Å;
   f) forming a second dielectric layer over said capacitor bottom plate, said first metal line, and a first dielectric layer;
      (1) said second dielectric layer is comprised of oxide and has a thickness between 1000 and 10,000 Å;
   g) forming a top plate opening in said second dielectric layer and first passivation layer to at least partially expose said capacitor bottom plate;
   h) forming a capacitor dielectric layer over said capacitor bottom plate, and said second dielectric layer;
      (1) said capacitor dielectric layer is comprised of SiN;
   i) forming a barrier layer over said capacitor dielectric layer;
      (1) said barrier layer is comprised of of a material selected from the group consisting of: TiN, TaN and Ta;
   j) forming a first metal layer over capacitor dielectric layer and said barrier layer;
      (1) said first metal layer comprised of Cu, W or Al alloy;
   k) planarizing said metal layer to form a capacitor top plate in said top plate opening; and to remove said barrier layer from over said second dielectric layer;
      (1) the planarization of said metal layer comprises chemical-mechanical polishing said metal layer;
   l) forming a second passivation layer over said capacitor top plate and said second dielectric layer;
      (1) said second passivation layer is comprised of SiN or SiC and has a thickness of between about 100 and 1000 Å;
   m) forming a via opening through at least said second dielectric layer, said capacitor dielectric layer, said second passivation layer and said first passivation layer over said first metal line to expose a portion of said first metal line;
   n) filling said via opening with a second metal layer to form a via plug;
      (1) said second metal layer is comprised of copper;
      (2) the step of filling said filling said via opening with a second metal layer comprises:
         forming a via plug barrier layer and said second metal layer over said semiconductor structure and filling said via opening; and
         chemical-mechanical polishing said second metal layer to a level about even with the top of said second dielectric layer; portions of said second passivation layer are removed by the chemical-mechanical polishing;
   o) forming a third passivation layer over said via plug and said capacitor top plate and said second dielectric layer;
      (1) said third passivation layer is comprised of SiN or SiC and has a thickness of between about 100 and 1000 Å;

p) forming a third dielectric layer over said third passivation layer;
q) forming a first trench opening and a second trench opening through said third dielectric layer and said third passivation layer;
  said first trench opening exposes a portion of said capacitor top plate;
  said second trench opening exposes a portion of said via plug;
r) forming a third metal layer at least filling said first trench opening and a second trench opening;
  (1) said third metal layer is comprised of copper;
s) planarizing said third metal layer to form a first trench plug in first trench opening and a second trench plug is said second trench opening;
  (1) whereby said via plug and said second trench plug form an interconnect;
    whereby said top plate, said capacitor dielectric and said bottom plate form a capacitor; said capacitor is part of a RF device.

20. The method of claim 19 wherein said capacitor bottom plate, said capacitor top plate, via plug; said first trench plug and said second trench plug include barrier layers.

* * * * *